US007486065B2

(12) United States Patent
Lin et al.

(10) Patent No.: US 7,486,065 B2
(45) Date of Patent: Feb. 3, 2009

(54) REFERENCE VOLTAGE GENERATOR AND METHOD FOR GENERATING A BIAS-INSENSITIVE REFERENCE VOLTAGE

(75) Inventors: Jyh-Fong Lin, Taipei (TW); Pei-Hsiu Huang, Taipei (TW)

(73) Assignee: VIA Technologies, Inc., Taipei (TW)

( * ) Notice: Subject to any disclaimer, the term of this patent is extended or adjusted under 35 U.S.C. 154(b) by 431 days.

(21) Appl. No.: 11/224,329

(22) Filed: Sep. 9, 2005

(65) Prior Publication Data

US 2006/0176042 A1 Aug. 10, 2006

Related U.S. Application Data

(60) Provisional application No. 60/650,716, filed on Feb. 7, 2005.

(51) Int. Cl.
*G05F 3/16* (2006.01)
*H01L 35/00* (2006.01)

(52) U.S. Cl. ....................... 323/313; 323/316; 323/907; 327/513

(58) Field of Classification Search ......... 323/312–316, 323/907; 307/512, 513; 327/512, 513
See application file for complete search history.

(56) References Cited

U.S. PATENT DOCUMENTS

| | | | | |
|---|---|---|---|---|
| 5,870,049 | A * | 2/1999 | Huang et al. | 341/144 |
| 6,586,964 | B1 * | 7/2003 | Kent et al. | 326/30 |
| 7,026,860 | B1 * | 4/2006 | Gheorghiu et al. | 327/513 |

* cited by examiner

*Primary Examiner*—Jessica Han
(74) *Attorney, Agent, or Firm*—Thomas, Kayden, Hortstemeyer & Risley

(57) ABSTRACT

The present invention is directed to a device and method for generating a reference voltage. A reference voltage generator comprises a first circuit, a second circuit, and an external device. The first circuit generates a positive temperature coefficient voltage. the second circuit is coupled to the first circuit, biased with a substantially constant current, produces a negative temperature coefficient voltage, and combines the negative temperature coefficient voltage with the positive temperature coefficient voltage as a reference voltage. The external device is coupled to the second circuit, and yields the substantially constant current.

17 Claims, 3 Drawing Sheets

REFERENCE VOLTAGE GENERATOR AND METHOD FOR GENERATING A BIAS-INSENSITIVE REFERENCE VOLTAGE

CROSS REFERENCE

This application claims the benefit of U.S. provisional application Ser. No. 60/650,716 filed Feb. 7, 2005, the subject matter of which is incorporated herein by reference.

BACKGROUND

The invention relates in general to reference voltage, and in particular, to a device and method for generating a bias insensitive bandgap voltage.

Reference voltages are utilized in analog circuits extensively. Such reference voltages are precise references that exhibit little or no dependence on process and voltage supply, and have a well defined dependence on the temperature. Various studies and researches have been put forward, in an attempt to realize the zero temperature coefficient, among which a bandgap voltage reference circuit is a popular approach.

For explanatory purposes, two terms are introduced here, namely, positive temperature coefficient and negative temperature coefficient. A positive temperature coefficient quantity denotes a proportional relationship to the absolute temperature, also known as proportional to absolute temperature (PTAT), whereas a negative temperature coefficient quantity represents a counter proportional relationship to the absolute temperature, typically referred to as counter proportional to absolute temperature (CTAT).

The bandgap voltage reference circuit is commonly deployed via the combination of a positive temperature coefficient voltage and a negative temperature coefficient voltage with proper weighing factors, to yield a zero temperature coefficient.

FIG. 1 is a circuit diagram of a conventional bandgap voltage reference circuit 1 comprising the first circuit 10 and the second circuit 12 coupled thereto. The first circuit 10 generates a positive temperature coefficient voltage $V_{PTAT}$, the second circuit 12 produces a negative temperature coefficient voltage $V_{CTAT}$. Combining positive temperature coefficient voltage $V_{PTAT}$ and negative temperature coefficient voltage $V_{CTAT}$ renders a bandgap reference voltage Vbg, ideally a constant quantity, irrespective to process, voltage supply, and temperature variation, and is represented by the relationship:

$$Vbg=V_{PTAT}+V_{CTAT} \tag{1}$$

The first circuit 10 comprises the first bipolar transistor Q1, the second bipolar transistor Q2, operational amplifier OP1, the first resistor R1, and second resistor R2. The first bipolar transistor Q1 is coupled to the first resistor R1, and then to the non-inverting input of operational amplifier OP1. The second bipolar transistor Q2 is coupled to the inverting input of operational amplifier OP1, such that different emitter-base voltages Veb1 and Veb2 are established across the first bipolar transistor Q1 and the second bipolar transistor Q2 respectively, resulting in an emitter-base voltages difference ΔVeb between Veb1 and Veb2 (ΔVeb=Veb2−Veb1), an inherent positive temperature coefficient voltage, at the output of operational amplifier OP1 coupled to the second resistor R2. Positive temperature coefficient voltage ΔVeb subsequently controls a positive temperature coefficient current $I_{PTAT}$ through the second resistor R2 and establish positive temperature coefficient voltage $V_{PTAT}$.

The second circuit 12 comprises the third bipolar transistor Q3 coupled to the second resistor R2, and rendering an inherent negative temperature coefficient voltage $V_{CTAT}$ across the emitter and base terminals thereof.

Unfortunately, positive temperature coefficient current $I_{PTAT}$ biasing the bipolar transistor Q3 impairs the performance of negative temperature coefficient voltage $V_{CTAT}$, since positive temperature coefficient current $I_{PTAT}$ introduces an opposite component in negative temperature coefficient voltage $V_{CTAT}$ and is process and temperature dependent. In practice the positive temperature coefficient current $I_{PTAT}$ may vary up to 20% from integrated circuit (IC) to IC due to process variation. Consequently bandgap reference voltage Vbg can no longer remain at a process and temperature insensitive voltage level. To counter this issue, extra circuit simulation and calibration are incorporated at the expense of production period and circuit complexity, both are undesirable factors in circuit implementation.

Thus, a reference voltage generator and method for generating a bias insensitive reference voltage is proposed.

SUMMARY

The invention is directed to a reference voltage generator and method for generating a reference voltage. In an exemplary embodiment, a reference voltage generator is described in the following. The reference voltage generator comprises a first circuit, a second circuit, and an external device. The first circuit generates a positive temperature coefficient voltage. The second circuit is coupled to the first circuit, biased with a substantially constant current to produce a negative temperature coefficient voltage, and combines the negative temperature coefficient voltage with the positive temperature coefficient voltage as a reference voltage. The external device is coupled to the second circuit, and yields the substantially constant current.

Another embodiment of a reference voltage generator incorporating a device to generate a reference voltage is described in the following. The device comprises a first circuit and a second circuit. The first circuit generates a positive temperature coefficient current and a positive temperature coefficient voltage. The second circuit is coupled to the first circuit, biased with a substantially constant current that is not the positive temperature coefficient current, produces a negative temperature coefficient voltage, and combines the negative temperature coefficient voltage with the positive temperature coefficient voltage as a reference voltage.

In an exemplary embodiment, a method for generating a reference voltage is described in the following. The method comprises providing a positive temperature coefficient voltage at a first circuit. The method further comprises biasing a second circuit with a substantially constant current from an external device. In addition, the method forms a negative temperature coefficient voltage at the second circuit. And finally, the method further combines the negative temperature coefficient voltage with the positive temperature coefficient voltage as the reference voltage.

BRIEF DESCRIPTION OF THE DRAWINGS

The invention will become more fully understood from the detailed description, given hereinbelow, and the accompanying drawings. The drawings and description are provided for purposes of illustration only and, thus, are not intended to be limiting of the present invention.

DETAILED DESCRIPTION

Reference will now be made in detail to the embodiments of the invention, examples of which are illustrated in the accompanying drawings.

Figure 2:
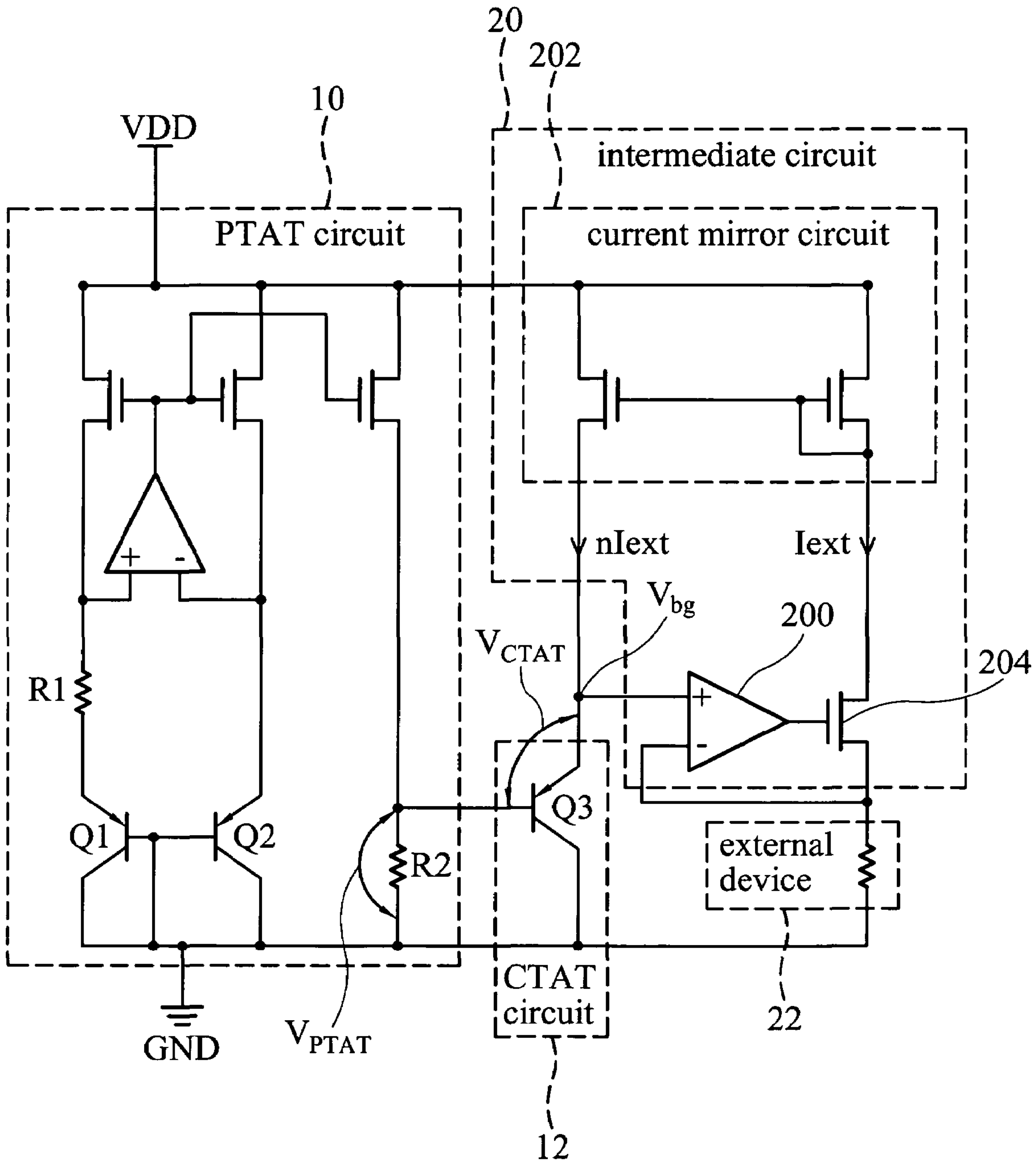
FIG. 2 is a circuit block diagram of an embodiment of a reference voltage generator.

FIG. 2. is a circuit diagram as an embodiment of a reference voltage generator 2, comprising PTAT circuit 10 (first circuit), CTAT circuit 12 (second circuit), intermediate circuit 20 (third circuit), and external device 22. PTAT circuit 10 is coupled to CTAT circuit 12, intermediate circuit 20, and to external device 22 subsequently.

PTAT circuit 10 generates a positive temperature coefficient voltage $V_{PTAT}$, whereas CTAT circuit 12 produces a negative temperature coefficient voltage $V_{CTAT}$ with external current Iext associated current nIext, where current nIext is associated with external current Iext by a factor n. External current Iext is introduced by external device 22, and may be a resistor, a capacitor, or any device capable of providing a substantially constant current Iext. Positive temperature coefficient voltage $V_{PTAT}$ in conjunction with negative temperature coefficient voltage $V_{CTAT}$ renders a substantially constant reference voltage Vbg.

A substantially constant voltage is exerted across external device 22 to establish substantially constant current Iext, which in turn is directed through intermediate circuit 20 to CTAT circuit 12 as a biasing current nIext. The substantially constant voltage may be reference voltage Vbg passed from CTAT circuit 12 via intermediate circuit 20.

Figure 1:
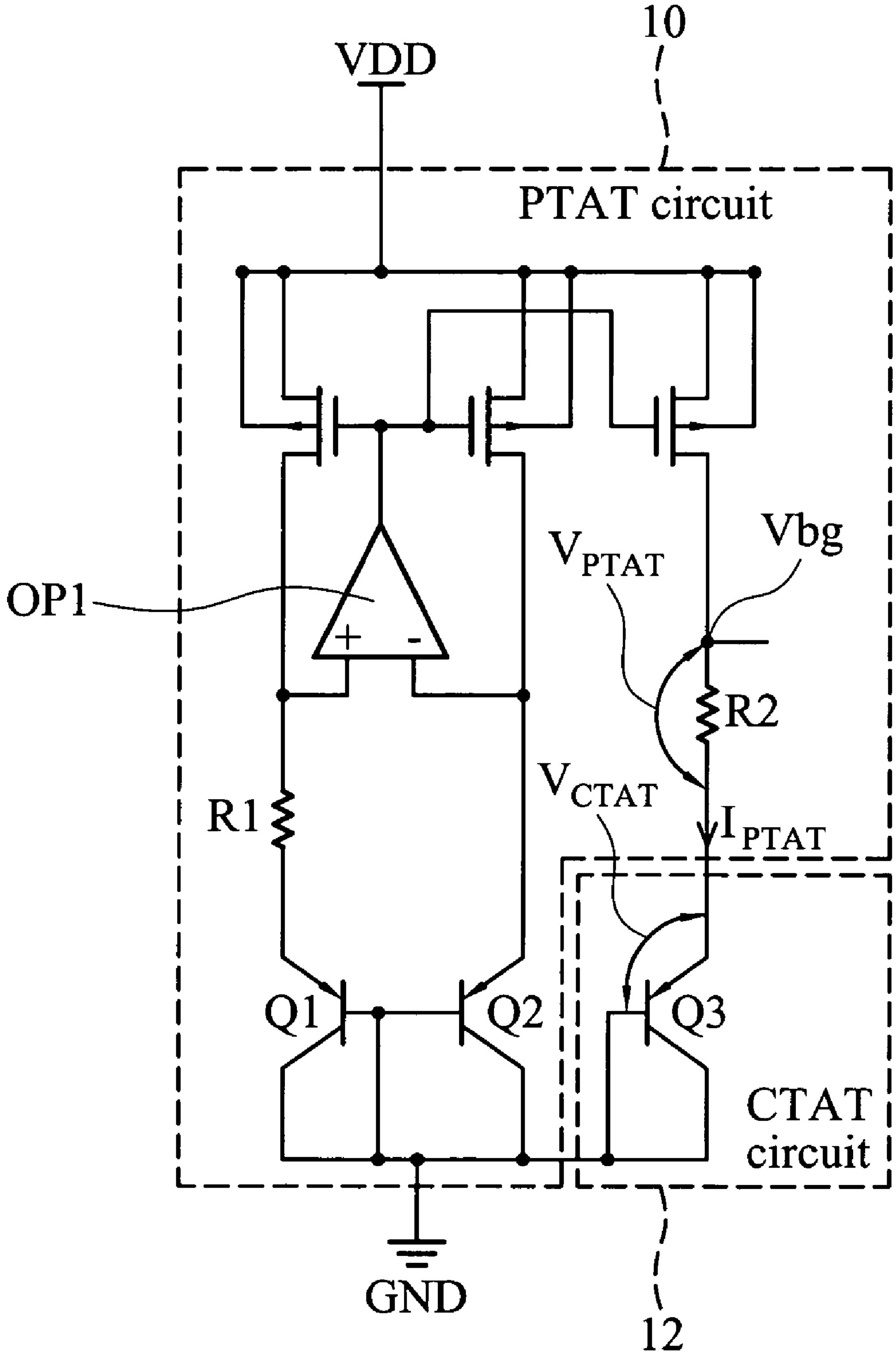
FIG. 1 is a schematic diagram of a conventional reference voltage circuit.

PTAT circuit 10 and CTAT circuit 12 may incorporate the circuit arrangement of FIG. 1, both of which and intermediate circuit 20 reside in an IC device. External device 22 is external to the IC device. Since external device 22 is not integral to the IC device, it is not affected by the 20% process variation inherited from the IC manufacturing process, and consequently can be controlled. In practice, the accuracy of the external resistor can be kept under 1% of its resistance.

Intermediate circuit 20 comprises operational amplifier 200, current mirror circuit 202 and transistor 204. Operational amplifier 200 is coupled to CTAT circuit 12 with the non-inverting input, to external device 22 with the inverting input, and to transistor 204 with the output. Transistor 204 is subsequently coupled to external device 22 and current mirror circuit 202.

Reference voltage Vbg is passed from CTAT circuit 12 to external device 22 through operational amplifier 200, such that a substantially constant voltage is applied across external device 22, and a substantially constant current nIext is fed back to CTAT circuit 12 through current mirror circuit 202, leading to a true negative temperature coefficient voltage $V_{CTAT}$ and a bias insensitive reference voltage Vbg.

Figure 3:
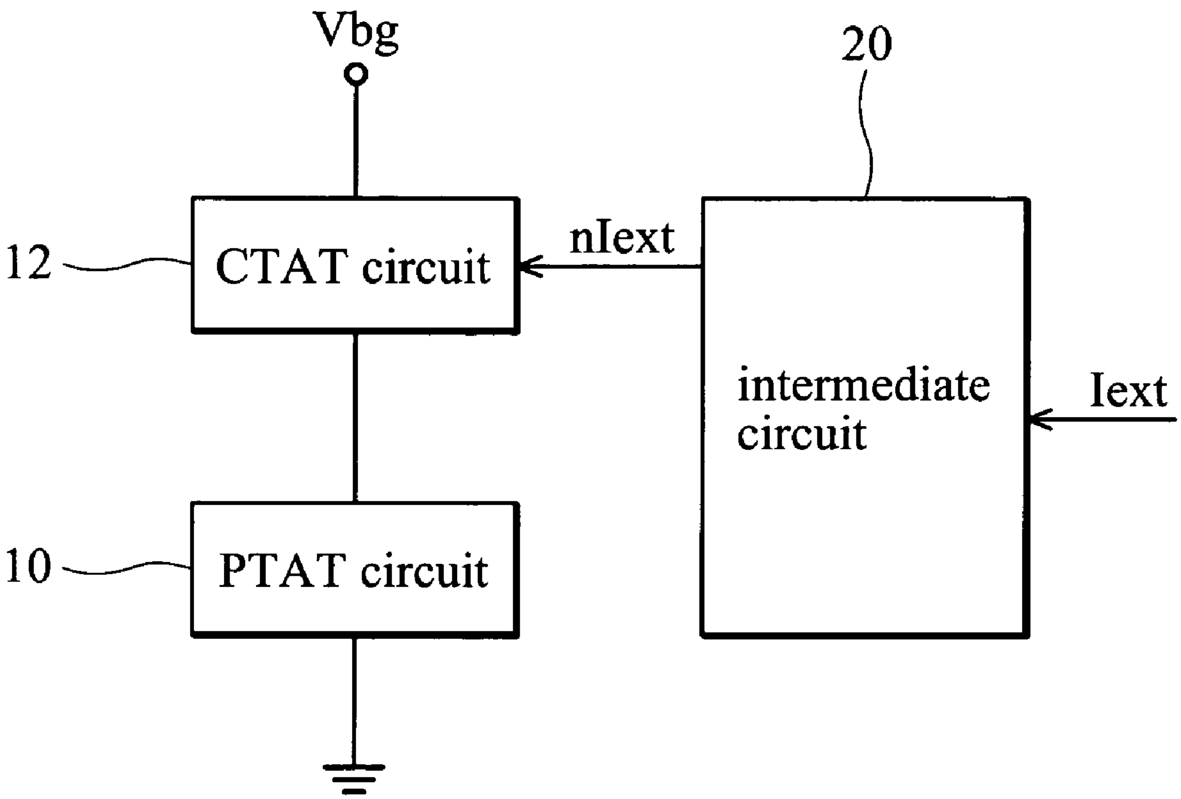
FIG. 3 is a block diagram of a device incorporated in the reference voltage generator in FIG. 2.

FIG. 3 shows a block schematic of a device 3 incorporated in the reference voltage generator in FIG. 2. The device comprises PTAT circuit 10 (first circuit), CTAT circuit 12 (second circuit), and intermediate circuit 20 (third circuit). PTAT circuit 10 is coupled to CTAT circuit 12, and then to intermediate circuit 20.

PTAT circuit 10 generates positive temperature coefficient current $I_{PTAT}$ and positive temperature coefficient voltage $V_{PTAT}$. CTAT circuit 12 is biased by a substantially constant current Iext that is not the positive temperature coefficient current $I_{PTAT}$ to produce negative temperature coefficient voltage $V_{CTAT}$, and combines positive and negative temperature coefficient voltage $V_{PTAT}$ and $V_{PTAT}$ to deliver reference voltage Vbg.

PTAT circuit 10, CTAT circuit 12, and intermediate circuit 20 may be realized as the circuit configuration of FIG. 2. Further, CTAT circuit 12 may be coupled to an external device to accept the substantially constant current nIext therethrough. The external device may be a resistor, a capacitor, or any device capable of providing a substantially constant current Iext.

An embodiment of a method for generating a reference voltage incorporating the reference voltage generator in FIG. 2, is described in the following.

Upon initialization, the method involves generating a positive temperature coefficient voltage $V_{PTAT}$ in PTAT circuit 10, and biasing CTAT circuit 12 with a substantially constant current Iext from external device 22 to produce negative temperature coefficient voltage $V_{CTAT}$. By combining the negative temperature coefficient voltage $V_{CTAT}$ with the positive temperature coefficient voltage $V_{PTAT}$, a substantially constant reference voltage Vbg is established.

Reference voltage Vbg is then applied to external device 22 via operational amplifier 200 in intermediate circuit 20. Since the precision of the external device 22 can be well controlled, the current Iext in this configuration is substantially constant, and is subsequently delivered to CTAT circuit 12 through current mirror circuit 202 in intermediate circuit 20. CTAT circuit 12 utilizes the substantially constant current Iext as a biasing current to generate negative temperature coefficient voltage $V_{CTAT}$. The method continues until the process of generating a reference voltage is terminated.

The invention is fully compatible with CMOS, bipolar and BiCMOS processes. Although a CMOS circuit has been described, those skilled in the art can adapt the invention as appropriate to bipolar and BiCMOS processes, without deviating from the spirit of the invention.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A reference voltage generator, comprising:

a first circuit generating a positive temperature coefficient voltage;

a second circuit coupled to the first circuit, biased by a substantially constant current, producing a negative temperature coefficient voltage, and combining the negative temperature coefficient voltage with the positive temperature coefficient voltage as a reference voltage; and an external device coupled to the second circuit, and yielding the substantially constant current;

wherein the first circuit comprises:

a first and a second bipolar transistors, with different current densities passing therethrough them respectively;

a first resistor connected to the first bipolar transistor; and a second resistor connected so that a voltage drop across the second resistor corresponds to the difference of base-emitter voltages of the first and the second bipolar transistors, resulting in the positive temperature coefficient voltage.

2. The reference voltage generator of claim 1, wherein the second circuit comprises a third bipolar transistor.

3. The reference voltage generator of claim 1, further comprising a third circuit coupled to the second circuit and the external device, such that the reference voltage is coupled to the external device and the substantially constant current is directed to the second circuit through the third circuit.

4. The reference voltage generator of claim 3, wherein the third circuit comprises an operational amplifier coupled to the second circuit and the external device, such that the reference voltage is applied to the external device.

5. The reference voltage generator of claim 3, wherein the third circuit further comprises a current mirror circuit coupled to the second circuit and the external device, such that the substantially constant current is received in the second circuit.

6. The reference voltage generator of claim 1, wherein the second circuit comprises a third bipolar transistor, an operational amplifier, a first transistor a second transistor, and a third transistor, wherein an emitter of the third bipolar transistor is coupled to a non-inverting input of the operational amplifier;

an inverting input of the operational amplifier is coupled to the external resistor, an output of the operational amplifier is coupled to a gate of the third transistor;

a source of the third transistor is coupled to a drain of the first transistor and a drain of the third transistor is coupled to the external resistor;

a gate of the first transistor is coupled to a gate of the second transistor and the drain of the first transistor, a source of the first transistor is coupled to a voltage source;

a drain of the second transistor is coupled to the non-inverting input of the operational amplifier and the emitter of the third bipolar transistor, a source of the second transistor is coupled to a voltage source; and a gate of the third bipolar transistor is coupled to the first circuit, and a collector of the third bipolar transistor is coupled to ground.

7. The reference voltage generator of claim 1, wherein the external device is a resistor coupled by the reference voltage.

8. A device to be incorporated to generate a reference voltage, comprising:

a first circuit generating a positive temperature coefficient current and a positive temperature coefficient voltage; and a second circuit coupled to the first circuit, biased by a substantially constant current that is not the positive temperature coefficient current, producing a negative temperature coefficient voltage, and combining the negative temperature coefficient voltage with the positive temperature coefficient voltage as a reference voltage; and wherein the first circuit comprises:

a first and a second bipolar transistors, with different current densities passing therethrough them respectively;

a first resistor connected to the first bipolar transistor; and a second resistor connected so that a voltage drop across the second resistor corresponds to the difference of base-emitter voltages of the first and the second bipolar transistors, resulting in the positive temperature coefficient voltage.

9. The device of claim 8, wherein the second circuit is further coupled to an external device to accept the substantially constant current therethrough.

10. The device of claim 8, wherein the second circuit comprises a third bipolar transistor.

11. The device of claim 8, further comprising an operational amplifier coupled to the second circuit and an external device, such that the reference voltage is applied to the external device.

12. The device of claim 8, further comprising a current mirror circuit coupled to the second circuit and an external device, such that the substantially constant current is received in the second circuit.

13. A method for generating a reference voltage, comprising:

providing a positive temperature coefficient voltage at a first circuit;

biasing a second circuit with a substantially constant current from an external device;

forming a negative temperature coefficient voltage at the second circuit; and combining the negative temperature coefficient voltage with the positive temperature coefficient voltage as the reference voltage; and wherein the first circuit comprises:

a first and a second bipolar transistors, with different current densities passing therethrough them respectively;

a first resistor connected to the first bipolar transistor; and a second resistor connected so that a voltage drop across the second resistor corresponds to the difference of base-emitter voltages of the first and the second bipolar transistors, resulting in the positive temperature coefficient voltage.

14. The method of claim 13, further comprising applying the reference voltage to the external device.

15. The method of claim 13, further comprising applying the reference voltage to the external device via a third circuit.

16. The method of claim 13, further comprising directing the substantially constant current from the external device to the second circuit via a fourth circuit.

17. The method of claim 13, wherein the second circuit comprises a third bipolar transistor.

* * * * *